(12) United States Patent  
Fan et al.

(10) Patent No.: US 8,390,614 B2
(45) Date of Patent: Mar. 5, 2013

(54) TIMING CONTROLLER AND CLOCK SIGNAL DETECTION CIRCUIT THEREOF

(75) Inventors: Wen-Teng Fan, Tainan County (TW); Shih-Chun Lin, Tainan County (TW)

(73) Assignee: Himax Technologies Limited, Tainan County (TW)

( * ) Notice: Subject to any disclaimer, the term of this patent is extended or adjusted under 35 U.S.C. 154(b) by 578 days.

(21) Appl. No.: 12/719,649

(22) Filed: Mar. 8, 2010

(65) Prior Publication Data

US 2011/0216057 A1 Sep. 8, 2011

(51) Int. Cl.
*G06F 3/038* (2006.01)
*G09G 5/00* (2006.01)

(52) U.S. Cl. ............... 345/213; 345/87; 345/98; 345/99; 348/537; 327/147; 327/149; 327/284; 327/407

(58) Field of Classification Search ............... 345/87, 345/98, 99, 213; 348/537; 327/147, 149, 327/284, 407; 375/373–377
See application file for complete search history.

(56) References Cited

U.S. PATENT DOCUMENTS

| 6,295,328 | B1* | 9/2001 | Kim et al. ............... 375/376 |
| 6,603,337 | B2* | 8/2003 | Cho ............... 327/149 |
| 7,123,063 | B2* | 10/2006 | Lutkemeyer ............... 327/149 |
| 7,236,028 | B1* | 6/2007 | Choi ............... 327/158 |
| 7,375,563 | B1* | 5/2008 | Cheung et al. ............... 327/156 |
| 7,839,190 | B2* | 11/2010 | Shin et al. ............... 327/158 |

* cited by examiner

*Primary Examiner* — Lun-Yi Lao
*Assistant Examiner* — Insa Sadio
(74) *Attorney, Agent, or Firm* — Rabin & Berdo, P.C.

(57) ABSTRACT

The clock signal detection circuit includes a lock detection circuit, a duty cycle detection circuit, a first logic circuit, and a counter. The lock detection circuit detects whether an input clock signal and a feedback clock signal of a delay locked loop are in phase. The duty cycle detection circuit detects whether the duty cycle of the input clock signal is within a percentage range. The first logic circuit, electrically connected to the lock detection circuit and the duty cycle detection circuit, outputs a detecting result signal which is at first logic level when the input clock signal are in phase with the feedback clock signal, and the duty cycle of the input clock signal is within a percentage range. The counter outputs a lock detection signal which is at the first logic level when the detecting result signal has maintained at the first logic level for a first constant period of time.

17 Claims, 5 Drawing Sheets

TIMING CONTROLLER AND CLOCK SIGNAL DETECTION CIRCUIT THEREOF

BACKGROUND

1. Field of Invention

The present invention relates to a timing controller. More particularly, the present invention relates to a clock signal detection circuit of an LVDS receiver.

2. Description of Related Art

As the data transmission speed grows, the transmission interface needs to have the high-speed, serial, differential, low power, and point-to-point characteristics. The LVDS (Low Voltage Differential Signaling) technology exactly has all the features that a high speed data transmission needs. The LVDS is a universal transmission protocol and has been extensively used in the systems requiring the integrity, low-jitter, and common-mode characteristics of signals, especially in the high-speed data transmission in communication systems and display interfaces.

It is common practice that the LVDS is implemented in ICs to overcome some deficiencies with previous I/O interface circuitry. As the input differential voltage of the LVDS receiver is very small (about 100 mV to 200 mV), and the switching speed of the input signal is very high (greater than 400 MHz), some issues need to be considered when an LVDS receiver is employed.

In LCD system, the LVDS interface is employed between the scaler and the timing controller to transmit data. When the LVDS pins are floating, there might be some noises on the LVDS cable, the PCB trace, or the timing controller input pins. These noises may induce abnormal displaying. Therefore, there is a need to distinguish the noises and the signals.

SUMMARY

According to one embodiment of the present invention, a clock signal detection circuit for detecting an input clock signal from a cable of a display driving system is disclosed. The clock signal detection circuit includes a lock detection circuit, a duty cycle detection circuit, a first logic circuit, and a counter.

The lock detection circuit detects whether an input clock signal and a feedback clock signal of a delay locked loop are in phase. The duty cycle detection circuit detects whether the duty cycle of the input clock signal is within a percentage range. The first logic circuit, electrically connected to the lock detection circuit and the duty cycle detection circuit, outputs a detecting result signal which is at first logic level when the input clock signal are in phase with the feedback clock signal, and when the duty cycle of the input clock signal is within a percentage range. The counter outputs a lock detection signal which is at the first logic level when the detecting result signal has maintained at the first logic level for a first constant period of time.

According to another embodiment of the present invention, a timing controller for generating the pixel data in a display driving system is disclosed. The timing controller includes a delay locked loop for delaying an input clock signal, and a clock signal detection circuit for detecting the input clock signal and the feedback clock signal. The clock signal detection circuit includes a lock detection circuit, a duty cycle detection circuit, a first logic circuit, and a counter.

The delay locked loop delays an input clock signal to generate a feedback clock signal. The lock detection circuit detects whether the input clock signal and the feedback clock signal of the delay locked loop are in phase. The duty cycle detection circuit detects whether the duty cycle of the input clock signal is within a percentage range. The first logic circuit, electrically connected to the lock detection circuit and the duty cycle detection circuit, outputs a detecting result signal which is at first logic level when the input clock signal are in phase with the feedback clock signal, and when the duty cycle of the input clock signal is within a percentage range. The counter outputs a lock detection signal which is at the first logic level when the detecting result signal has maintained at the first logic level for a first constant period of time.

It is to be understood that both the foregoing general description and the following detailed description are by examples, and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

Figure 1A:
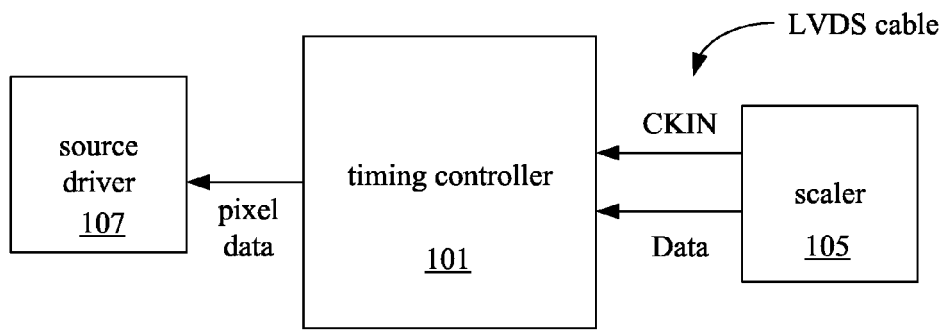
FIG. 1A shows the block diagram of the display driving system according to one embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1A shows the block diagram of the display driving system according to one embodiment of the present invention. The display driving system includes the scaler 105, the timing controller 101, and the source driver 107. The scaler 105, dealing with the pixel information such as information about the pixel number, outputs the input clock signal CKIN and the data signal Data to the timing controller 101 through the Low Voltage Differential Signaling (LVDS) cable. The timing controller 101 generates the pixel data according the received input clock signal CKIN and the data signal Data. The source driver 107 converts the pixel data into the driving voltage to drive the pixels on the display panel (not shown).

Figure 1B:
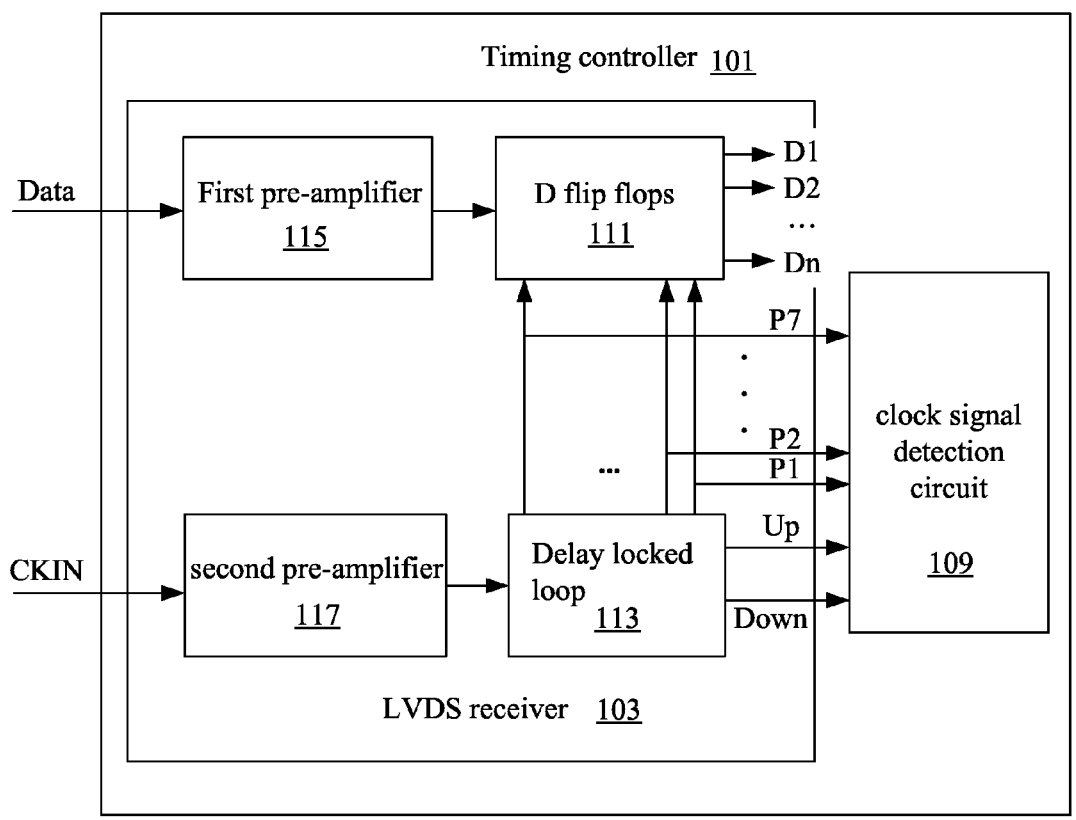
FIG. 1B shows the block diagram of the timing controller of the display driving system according to one embodiment of the present invention.

FIG. 1B shows the block diagram of the timing controller of the display driving system according to one embodiment of the present invention. The timing controller 101 includes the LVDS receiver 103 for receiving and processing the input clock signal CKIN and the data signal Data, and also includes the clock signal detection circuit 109 for detecting the input clock signal CKIN.

The LVDS receiver 103 includes the first pre-amplifier 115, the second pre-amplifier 117, the D flip flops 111 and the delay locked loop 113. The first pre-amplifier 115 and the second pre-amplifier 117 amplify the data signal Data and the input clock signal CKIN respectively. The delay locked loop 113 receives the amplified input clock signal CKIN, and generates the phase signals P1, P2, . . . P7, the up signal Up, and the down signal Down accordingly for the D type flip flops 111 and the clock signal detection circuit 109. The D flip flops 111 divides the amplified data signal Data into several individual data D1, D2 . . . Dn according to the phase signals P1, P2, . . . P7.

The clock signal detection circuit 109 detects whether the input clock signal CKIN and the feedback clock signal CKFB of a delay locked loop 113 are in phase according to the up signal Up and the down signal Down, and detects whether the duty cycle of the input clock signal CKIN is within a percentage range according to the phase signals P1, P2, . . . P7.

Figure 1C:
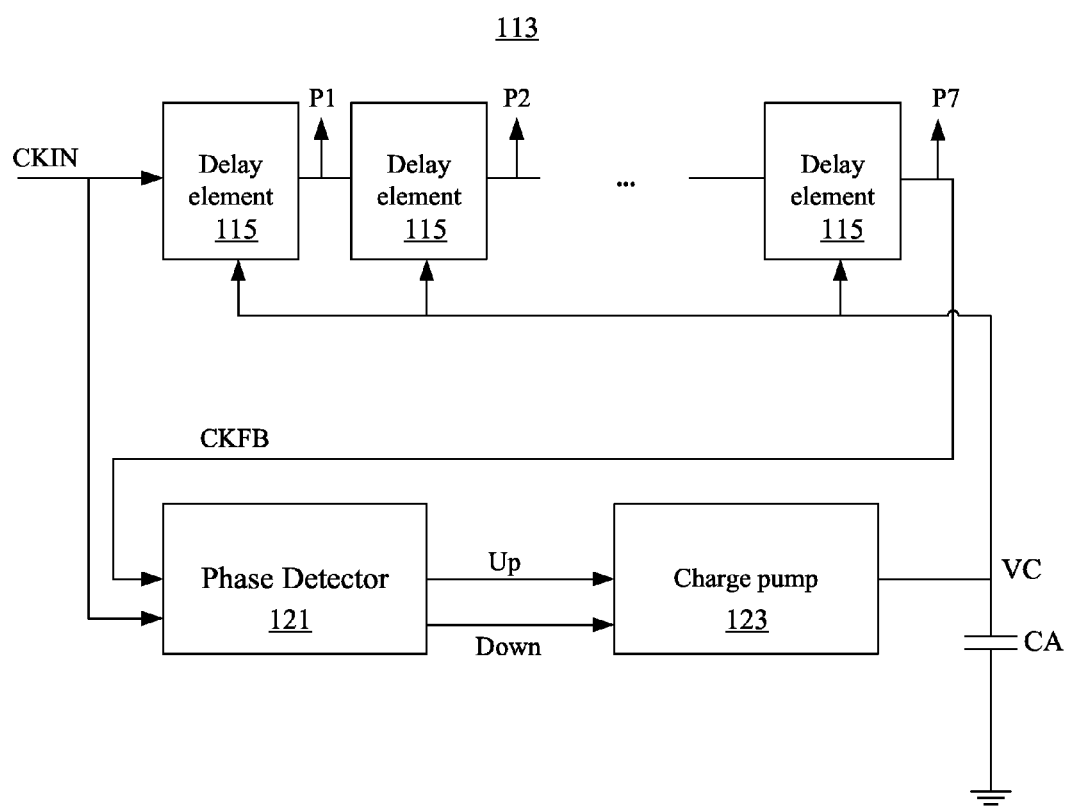
FIG. 1C shows the block diagram of the delay locked loop of the LVDS receiver according to one embodiment of the present invention.

FIG. 1C shows the block diagram of the delay locked loop of the LVDS receiver according to one embodiment of the present invention. The delay locked loop 113 delays the input clock signal CKIN to generate the feedback clock signal CKFB. The delay locked loop 113 includes the phase detector 121, the delay elements 115, and the charge pump 123.

The phase detector 121 outputs the up signal Up when the feedback clock signal CKFB lags the input clock signal CKIN, and outputs the down signal Down when the feedback clock signal FBCK leads the input clock signal CKIN. Furthermore, the pulse width of the up signal Up and the pulse width of the down signal Down are different if the feedback clock signal CKFB and the input clock signal CKIN are not in phase, that is, the feedback clock signal CKFB and the input clock signal CKIN have phase difference between them. In contrast, if the pulse width of the up signal Up and the pulse width of the down signal Down are the same, the feedback clock signal CKFB and the input clock signal CKIN are in phase. In other words, the pulses of the up signal Up and the down signal Down are compared to identify if the delay locked loop is locked.

The charge pump 123 charges the terminal voltage VC on the capacitor CA to decrease the delay time of the delay elements 115 when the phase detector 121 outputs the up signal Up. On the other hand, the charge pump 123 discharges the terminal voltage VC on the capacitor CA to increase the delay time of the delay elements 115 when the phase detector 121 outputs the down signal Down.

The delay elements 115 delay the input clock signal CKIN to generate the feedback clock signal CKFB and the phase signals P1, P2 . . . P7. In this delay locked loop 113, each of these delay elements 115 delays the received clock signal with the same delay time which is controlled by the terminal voltage VC charged or discharged by the charge pump 123.

Figure 2A:
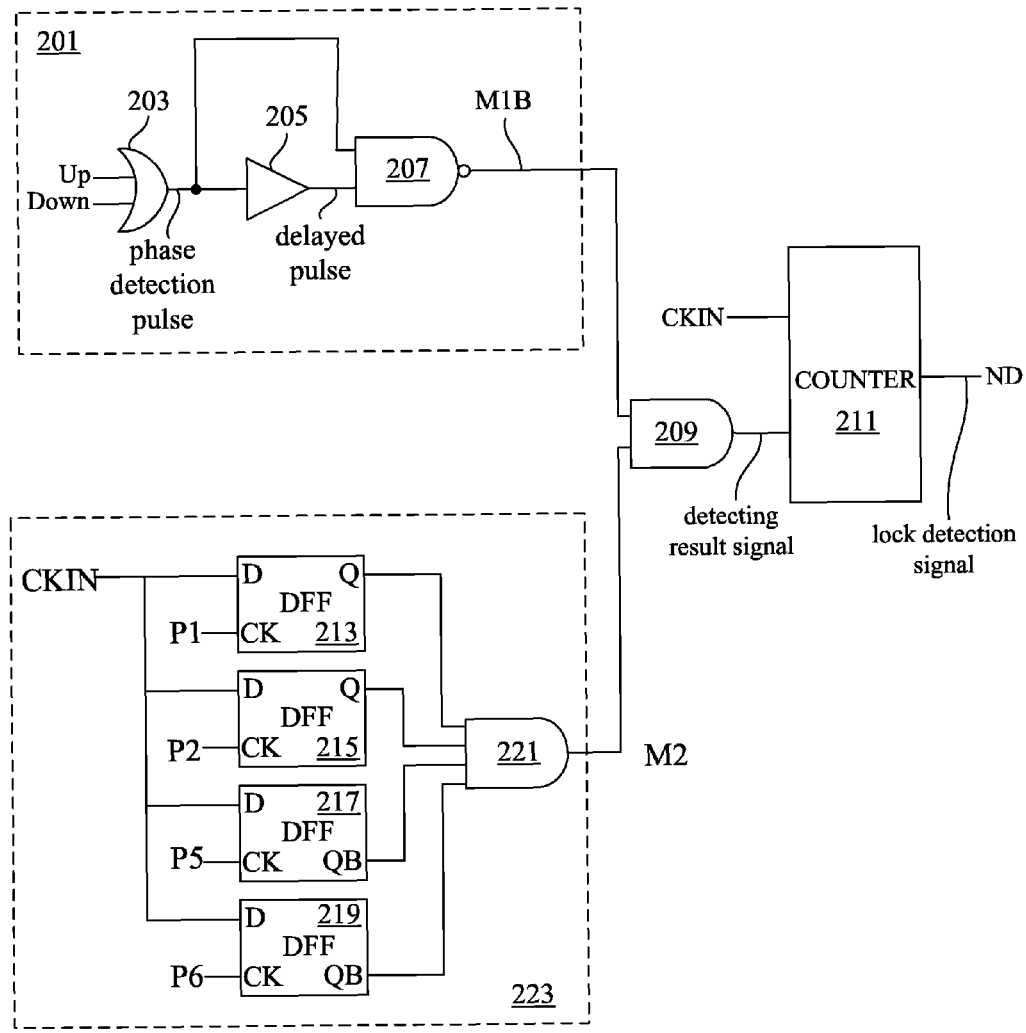
FIG. 2A shows the clock signal detection circuit according to one embodiment of the present invention.

FIG. 2A shows the clock signal detection circuit according to one embodiment of the present invention. The clock signal detection circuit 109, detecting the input clock signal CKIN from a cable of a display driving system, includes a lock detection circuit 201, a duty cycle detection circuit 223, a first logic circuit such as the first and-gate 209, and a counter 211.

The lock detection circuit 201, detecting whether an input clock signal CKIN and a feedback clock signal CKFB of a delay locked loop 113 are in phase, includes an or-gate 203, a delay circuit 205, and a NAND gate 207. The or-gate 203 outputs a phase detection pulse when at least one of the up signal Up and the down signal Down is at high logic level, that is, the input clock signal CKIN and the feedback clock signal CKFB are not in phase.

The delay circuit 205 delays the phase detection pulse for a second constant period of time to be a delayed pulse, and the second constant period of time=(1/frequency of the input clock signal)×10%. For example, if the frequency of the input clock signal CKIN is 100 MHZ, the second constant period of time will be 1 ns. The NAND gate 207 is electrically connected to the or-gate 203, the delay circuit 205 and the first and-gate 209, in which the NAND gate 207 outputs the low logic level when both the phase detection pulse and the delayed pulse are at high logic level.

The second constant period of time employed by the delay circuit 205 is adjustable, and is corresponding to the detection precision. In order to prevent the high logic level outputted from the NAND gate 207, the phase of the feedback clock signal CKFB needs to be even closer to the phase of the input clock signal CKIN as the delay time of the delay circuit 205 becomes shorter, that is, the feedback clock signal CKFB is even more in phase with the input clock signal CKIN.

Figure 2B:
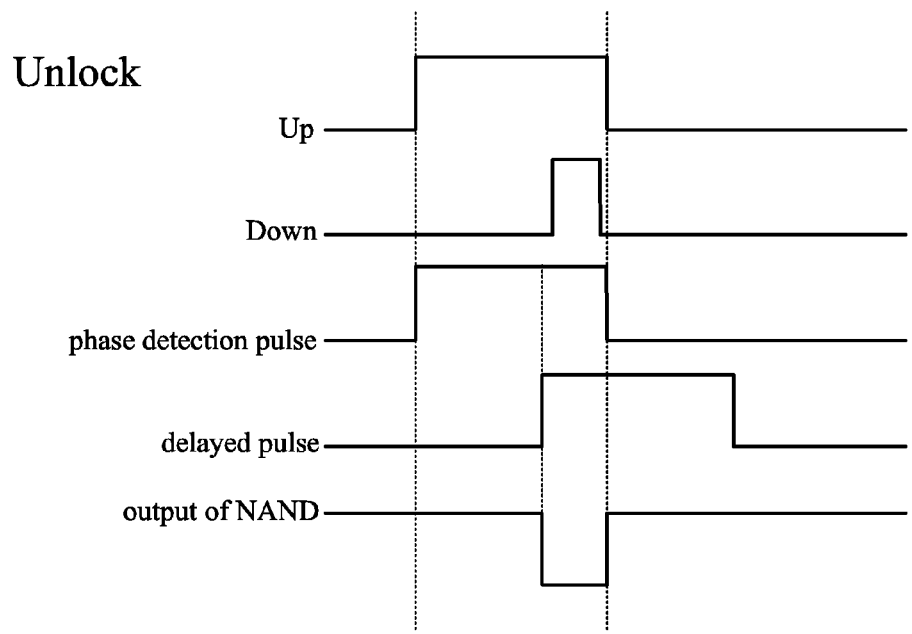
FIG. 2B shows the signal waveforms of the clock signal detection circuit according to one embodiment of the present invention.
Figure 2C:
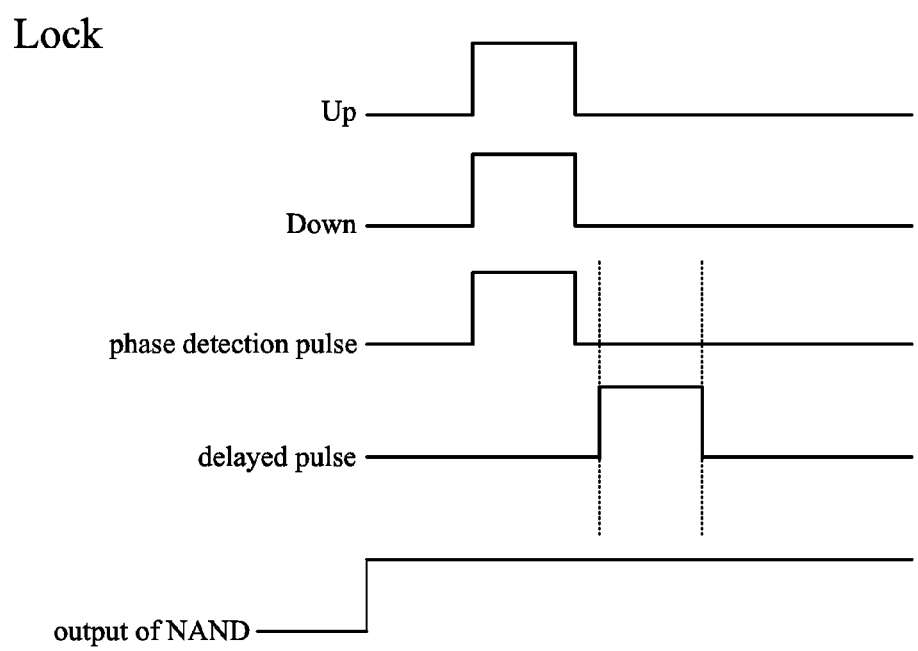
FIG. 2C shows the signal waveforms of the clock signal detection circuit according to one embodiment of the present invention.

As the Unlock state shown in FIG. 2B, the phase detection pulse appears because at least one of the up signal Up and the down signal Down is at high logic level. As a result, the phase detection pulse overlaps portion of the delayed pulse, which makes the output of the NAND gate 207 be at the low logic level. On the other hand, the phase detection pulse doesn't overlap the delayed pulse as the lock state shown in FIG. 2C, therefore, the output of the NAND gate 207 keeps at high logic level, and no pulse appears.

FIG. 2A also shows the duty cycle detection circuit 223 which detects whether the duty cycle of the input clock signal CKIN is within a percentage range. For example, the duty cycle detection circuit 223 might detect if the percentage range of the duty cycle is between 30% and 60%, that is, the duty cycle detection circuit 223 detects if the ratio of the high logic level to the low logic level of the input clock signal CKIN ranges from 3:4 to 4:3. The duty cycle detection circuit 223 includes a first D flip flop 213, a second D flip flop 215, a third D flip flop 217, and a fourth D flip flop 219, and a second logic circuit such as the second and-gate 221.

The input clock signal CKIN from the delay locked loop 113 (shown in FIG. 1C) is inputted to the data input terminals of the first D flip flop 213, the second D flip flop 215, the third D flip flop 217, and the fourth D flip flop 219. In addition, the first phase signal P1, the second phase signal P2, the fifth phase signal P5, and the sixth phase signal P6 from the delay locked loop 113 are inputted to the clock input terminals of the first D flip flop 213, the second D flip flop 215, the third D flip flop 217, and the fourth D flip flop 219. Particularly, the first phase signal P1 is generated by delaying the input clock signal CKIN with a signal delay time, while the second phase signal P2, the fifth phase signal P5, and the sixth phase signal P6 are generated by delaying the input clock signal CKIN with a double delay time, a quintuple delay time, and a sextuple delay time, respectively.

When the duty cycle of the input clock signal CKIN is within a percentage range, the input clock signal CKIN sampled at the rising edges of the first phase signal P1 and the second phase signal P2 should be at high logic level, and the input clock signal CKIN sampled at the rising edges of the fifth phase signal P5 and the sixth phase signal P6 should be at low logic level, in which case the four inputs of the second and-gate 221 are at high logic level, and the duty cycle detection circuit 223 can output the high logic level.

The first and-gate 209, electrically connected to the lock detection circuit 201 and the duty cycle detection circuit 223, outputs a detecting result signal which is at high logic level when the input clock signal CKIN are in phase with the feedback clock signal CKFB, and when the duty cycle of the input clock signal CKIN is within a percentage range. In detail, there are two requirements to be met to make the output of the first and-gate 209 stay at high logic level: one is that the delay locked loop is at the lock state (the input clock signal CKIN and the feedback clock signal CKFB are in phase); the other is that the duty cycle of the input clock signal CKIN is within 30%-60% of the whole input clock signal cycle.

The counter 211 outputs a lock detection signal ND which is at the high logic level when the detecting result signal has maintained at the high logic level for a first constant period of time, which means that the input clock signal CKIN is stable, and the delay locked loop is locked. On the other hand, the counter 211 is reset to recount and the lock detection signal changes to the low logic level if the detecting result signal falls back to the low logic level, and the input clock signal CKIN is still unstable in this situation. In this embodiment, the first constant period of time can be adjustable, such as 32 clock cycles or more.

Figure 3:
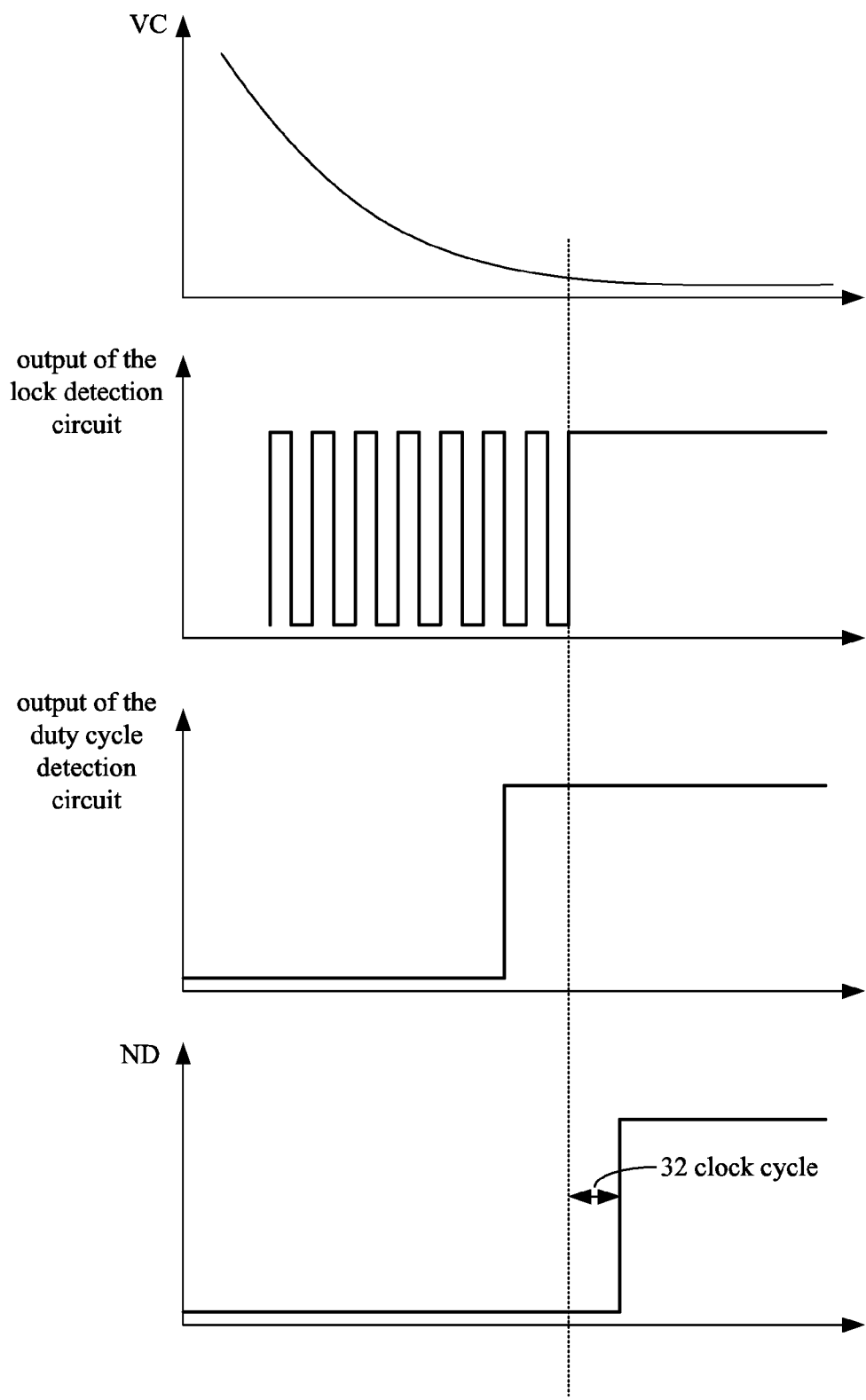
FIG. 3 shows the signal waveforms of the clock signal detection circuit according to one embodiment of the present invention.

FIG. 3 shows the signal waveforms of the clock signal detection circuit according to one embodiment of the present invention. As the terminal voltage VC goes stable, the output of the lock detection circuit and the output of the duty cycle detection circuit go stable, too, and the lock detection signal ND from the counter stays at high logic level, which means the detected input clock signal meets the requirements.

According to the above embodiments, the timing controller and the clock signal detection circuit thereof can detect whether the frequency and the duty cycle of the input clock signal is as required, such that the noises can be distinguished from the correct clock signal. Therefore, the display driving system can process data according the correct clock signal.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A clock signal detection circuit for detecting an input clock signal from a cable of a display driving system, comprising:
   a lock detection circuit for detecting whether an input clock signal and a feedback clock signal of a delay locked loop are in phase;
   a duty cycle detection circuit for detecting whether a duty cycle of the input clock signal is within a percentage range;
   a first logic circuit, electrically connected to the lock detection circuit and the duty cycle detection circuit, for outputting a detecting result signal which is at first logic level when the input clock signal are in phase with the feedback clock signal, and when the duty cycle of the input clock signal is within a percentage range; and
   a counter for outputting a lock detection signal which is at the first logic level when the detecting result signal has maintained at the first logic level for a first constant period of time.

2. The clock signal detection circuit as claimed in claim 1, wherein the lock detection circuit comprises:
   an or-gate for outputting a phase detection pulse when the input clock signal and the feedback clock signal are not in phase;
   a delay circuit for delaying the phase detection pulse for a second constant period of time to be a delayed pulse; and
   a NAND gate electrically connected to the or-gate, the delay circuit and the first logic circuit, wherein the NAND gate outputs a second logic level when both the phase detection pulse and the delayed pulse are at first logic level.

3. The clock signal detection circuit as claimed in claim 2, wherein the duty cycle detection circuit comprises:
   a first D flip flop for receiving the input clock signal and a first phase signal from the delay locked loop;
   a second D flip flop for receiving the input clock signal and a second to phase signal from the delay locked loop;
   a third D flip flop for receiving the input clock signal and a fifth phase signal from the delay locked loop;
   a fourth D flip flop for receiving the input clock signal and a sixth phase signal from the delay locked loop; and
   a second logic circuit electrically connected to the first, the second, the third, and the fourth D flip flops.

4. The clock signal detection circuit as claimed in claim 3, wherein the input clock signal is inputted to a plurality of data input terminals of the D flip flops.

5. The clock signal detection circuit as claimed in claim 4, wherein the first phase signal, the second phase signal, the fifth phase signal, and the sixth phase signal are respectively inputted to clock input terminals of the D flip flops.

6. The clock signal detection circuit as claimed in claim 2, wherein the first logic level is a high logic level, and the second logic level is a low logic level.

7. The clock signal detection circuit as claimed in claim 1, wherein the percentage range is from 30% to 60% of cycle of the input clock signal.

8. The clock signal detection circuit as claimed in claim 1, wherein the cable is a Low Voltage Differential Signaling (LVDS) cable.

9. A timing controller for generating pixel data in a display driving system, comprising:
   a delay locked loop for delaying an input clock signal to generate a feedback clock signal; and
   is a clock signal detection circuit for detecting the input clock signal and the feedback clock signal, the clock signal detection circuit comprising:
      a lock detection circuit for detecting whether the input clock signal and the feedback clock signal of the delay locked loop are in phase;
      a duty cycle detection circuit for detecting whether the duty cycle of the input clock signal is within a percentage range;
      a first logic circuit, electrically connected to the lock detection circuit and the duty cycle detection circuit, for outputting a detecting result signal which is at a first logic level when the input clock signal are in phase with the feedback clock signal, and when the duty cycle of the input clock signal is within a percentage range; and
      a counter for outputting a lock detection signal which is at the first logic level when the detecting result signal has maintained at the first logic level for a first constant period of time.

10. The timing controller as claimed in claim 9, wherein the delay locked loop comprises:
    a phase detector for outputting an up signal when the feedback clock signal lags the input clock signal, and for outputting a down signal when the feedback clock signal leads the input clock signal;
    to a plurality of delay elements for delaying the input clock signal to generate the feedback clock signal; and a charge pump for decreasing a delay time of the delay elements when the phase detector outputs the up signal, and for increasing the delay time of the delay elements when the phase detector outputs the down signal.

11. The timing controller as claimed in claim 10, wherein the lock detection circuit comprises:

an or-gate for outputting a phase detection pulse when at least one of the up signal and the down signal is at the first logic level;

a delay circuit for delaying the phase detection pulse for a second constant period of time to be a delayed pulse; and a NAND gate electrically connected to the or-gate, the delay circuit and the first logic circuit, wherein the NAND gate outputs a second logic level when both the phase detection pulse and the delayed pulse are at the first logic level.

12. The timing controller as claimed in claim 11, wherein the first logic level is a high logic level, and the second logic level is a low logic level.

13. The timing controller as claimed in claim 10, wherein the duty cycle detection circuit comprises:

a first D flip flop for receiving the input clock signal and a first phase signal from one of the delay elements;

a second D flip flop for receiving the input clock signal and a second phase signal from one of the delay elements;

a third D flip flop for receiving the input clock signal and a third phase signal from one of the delay elements;

a fourth D flip flop for receiving the input clock signal and a fourth phase signal from one of the delay elements; and a second logic circuit electrically connected to the first, the second, the third, and the fourth D flip flops.

14. The timing controller as claimed in claim 13, wherein the input clock signal is inputted to a plurality of data input terminals of the D flip flops.

15. The timing controller as claimed in claim 13, wherein the first phase signal, the second phase signal, the third phase signal, and the fourth phase signal are respectively inputted to a plurality of clock input terminals of the D flip flops.

16. The timing controller as claimed in claim 9, wherein the percentage range is from 30% to 60% of cycle of the input clock signal.

17. The timing controller as claimed in claim 9, wherein the cable is a Low Voltage Differential Signaling (LVDS) cable.

* * * * *